United States Patent [19]

Petrie

[11] 4,110,698
[45] Aug. 29, 1978

[54] DIGITAL WAVEFORM CONDITIONING CIRCUIT

[76] Inventor: Adelore F. Petrie, 7 W. Lillian, Arlington Heights, Ill. 60004

[21] Appl. No.: 761,470

[22] Filed: Jan. 21, 1977

[51] Int. Cl.² ............................................. H03K 5/01
[52] U.S. Cl. ................................. 328/164; 307/268; 328/128; 328/165
[58] Field of Search .............. 307/268, 230, DIG. 1, 307/247 A; 328/127, 128, 162, 164, 167, 165

[56] References Cited

U.S. PATENT DOCUMENTS 3,588,531   6/1971   Bjor .................................. 328/127 X
3,802,747   4/1974   Burckhardt et al. ............ 328/127 X Primary Examiner—John Zazworsky
Attorney, Agent, or Firm—Darbo & Vandenburgh

[57] ABSTRACT

A digital waveform conditioning circuit includes a non-inverting amplifier stage. A source of digital information is coupled to the input of the amplifier via a series resistor. The amplifier output is coupled to a digital utilization circuit. A feedback capacitor is coupled between the amplifier input and output terminals to provide integration of unwanted input noise pulses, positive feedback during threshold transitions for fast rise and fall times, and a hold-off voltage for a specified time thereafter to prevent oscillations during said transitions.

4 Claims, 3 Drawing Figures

DIGITAL WAVEFORM CONDITIONING CIRCUIT

BACKGROUND OF THE INVENTION

This invention relates generally to digital electronic systems, in particular waveform restoration systems used therein. Digital electronic systems utilize information encoded into sequential binary signals existing in either of two digital logic "states" to communicate or translate information between a number of information processing system components. A typical digitally encoded signal comprises a plurality of "squared" pulse-like signals. In order to effectively utilize such digital signals, a great number of encoding languages have been developed each being composed of combinations or sequences of binary two-state signals. While the languages used and systems processing them vary greatly in content format and encoding systems, all share the common requirement of a "clear" transition to perform effectively.

However, even within the most rudimentary digital logic systems a number of noise or extraneous signal sources are constantly in action which often contaminate the digital signal. Unless the effect of such noise is eliminated erroneous system performance can result. One common source of such noise is found in the transients which accompany electrical switching. Most typically these transients arise as electrical contacts mate or part producing a "spike" that is a sharp, short duration signal. Transients also arise due to contact bounce which produces a series of closely spaced noise pulses. In either case the noise signals combine with the digital information and are often interpreted as desired signals by the system. This, of course, gives rise to erroneous system output.

Digital logic systems are complex and perform their interpretive and calculative processes as well as information storage and retrieval through the use of great numbers of information translating devices. They inherently require a great variety and number of switches and switching systems to properly implement system operation. Even within the most sophisticated and up-to-date digital logic systems switches are used to route signal and information which must of necessity make and break a great number of electrical connections which give rise to transient or spike responses.

In addition to switching transient problems noise may be produced outside the logic system. For example, one of the most promising yet challenging environments for digital systems is the utilization of the vast telephone network as a distribution system. While the potential for digital system use of the telephone distribution system is great, the challenge presented to a digital system in utilizing the telephone distribution network is also great. Telephone systems are in essence vast switching networks which during normal performance are extremely laden with switching transient noises making their use by digital information systems difficult.

These and other noise problems have led practitioners in the art to develop numerous signal conditioning systems, the simplest of which is a passive integrating network such as set forth in U.S. Pat. No. 3,466,647, issued to John Guzak, Jr. In the system shown a number of keyboard switches are used to couple information into digital logic circuitry. Guzak provides a plurality of capacitors in parallel with the switches which integrate the switching transients and dampen switch action. It is also known to utilize active integrators such as those shown in U.S. Pat. No. 3,405,286, issued to R. Mudie, and U.S. Pat. No. 3,792,363, issued to Gebel et al. Such active integrators comprise combinations of an inverting amplifier stage and A.C. feedback network (such as a capacitor) which couple a portion of the output signal back to the input terminal to produce negative feedback. The basic idea is to provide a negative feedback or gain reduction for signals of higher frequency typical of those forming transient or noise spikes within the signal. While both active and passive type integrators can under many conditions effectively reduce the high frequency transient noise content of the digital binary encoded signal they unfortunately also introduce an often undesirable increase in the rise and fall times of the digital signal.

U.S. Pat. No. 3,513,333, issued to R. T. Andersen, sets forth an inverting amplifier having a positive feedback system which is directed primarily to minimizing the effects of noise transients produced by "contact bounce" within the system. As mentioned, contact bounce is present when a mechanical circuit breaker separates or mates ineffectively and produces a series of connect and disconnect transients in short succession after switch actuation. Andersen recognizes this fact and uses an amplifier in combination with a positive A.C. feedback network to supply a hold-off voltage causing the amplifying network to ignore noise signals occurring during the interval following switch actuation. While the described system is somewhat effective against the particular family of noise produced by switch contact bounce, the inverting amplifier and positive feedback offers little in the way of protection from noise transients occurring at other times within the system.

Still another apparatus for reducing the noise within digital systems is set forth in U.S. Pat. No. 3,824,583, issued to Quentin C. Turtle, which discloses a monostable multivibrator circuit (often called a "one-shot" multivibrator) which is characterized by the generation of an output signal pulse in response to an input trigger signal. The output signal has a duration independent of the input trigger signal duration. One of the primary benefits of such one-shot multivibrators arises from their inherent rejection of any trigger during the duration of their output pulse; however, they will still trigger at other times on noise pulses. A somewhat similar device well known in the art and often used to remove noise from digital encoded information signals is that of a Schmitt trigger. While somewhat similar to a monostable multivibrator, Schmitt trigger circuits tolerate more noise due to their displaced thresholds and enhance rise times due to their positive feedback. Schmitt triggers are often referred to as "squaring" circuits. Again, their use in digital systems is limited due to their displaced thresholds and their inability to reject large noise pulses. Both monostable multivibrators and Schmitt triggers offer some advantages in the art of noise suppression. However, their circuit construction is generally complex and limited in performance and the need arises for a simpler, more effective waveform conditioning circuit within the digital art.

Accordingly, it is an object of the present invention to provide an improved waveform conditioning system for use in a digital electronic information system. It is a more particular object of the present invention to provide an improved waveform conditioning network which utilizes a minimum number of system components and produces effective noise elimination without substantial deleterious effect upon the rise and fall times of the digital signal.

SUMMARY OF THE INVENTION

A digital waveform conditioning circuit for use in a digital electronic information system in which information is arranged in a sequence of signals having predetermined logic states, said signals being subjected to extraneous noise and switching transients which tend to produce undesired reactions within said information system; comprises a signal buffer amplifier having a gain of more than one, responsive to an applied sequence of signals, producing an output sequence of signals having the same polarity as the applied signals, a resistor in series with the input of said amplifier, and a capacitor connected between the input and output terminals of said amplifier.

DESCRIPTION OF SPECIFIC EMBODIMENTS

The following disclosure is offered for public dissemination in return for the grant of a patent. Although it is detailed to ensure adequacy and aid understanding, this is not intended to prejudice that purpose of a patent which is to cover each new inventive concept therein no matter how others may later disguise it by variations in form or additions or further improvements.

Figure 1:
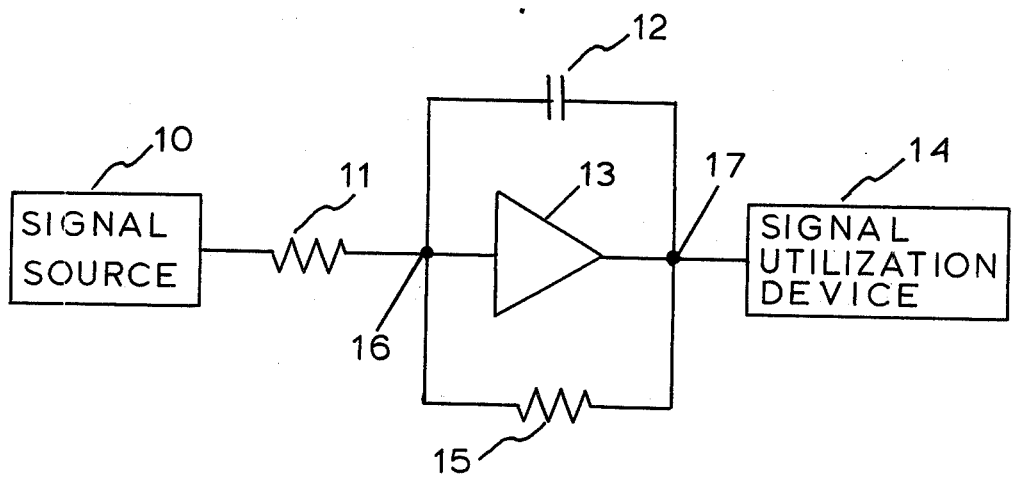
FIG. 1 is a block diagram of a digital waveform conditioning circuit constructed in accordance with the present invention.

FIG. 1 shows a waveform conditioning circuit constructed in accordance with the present invention in which a source 10 of digitally encoded information is coupled via a series resistor 11 to an input terminal 16 of a buffer amplifier stage 13. The output terminal 17 of buffer stage 13 is coupled to a digital information utilization device 14. A feedback capacitor 12 is coupled between input terminal 16 and output terminal 17 of buffer stage 13. A resistor 15 is also coupled between input terminal 16 and output terminal 17. Digital information source 10 may include any digital system component. For example, digital source 10 may form the output of a computer telephone terminal which receives digitally encoded information over the telephone network system. Similarly, digital information source 10 may also comprise any of the well-known digital readout components such as the output of a computer or the like. Similarly, digital utilization device 14 may comprise virtually any digital system or subsystem which would normally be coupled to digital information source 10. For example, the device 14 may comprise the input terminal of a computer being fed from a telephone line source formed by digital information source 10. Or, digital utilization device 14 may comprise a second computer receiving an information transfer from a first computer of source 10. In other words, the present invention wave conditioning circuit is likely to find application between any two digital system components.

Buffer amplifier stage 13 is characterized by a noninverting relationship between its input and output signals. For example, if a positive-going pulse is applied to input terminal 16 a positive-going pulse would appear at output terminal 17 and be coupled to digital utilization system 14. A number of well-known gate and amplifier combinations may be utilized to perform this buffer stage function. For example, an AND gate which produces an output signal of the same polarity when its input terminals coincide will provide the noninverting output signal of buffer 13 if both its input terminals are commonly coupled to resistor 11 and its output terminal coupled to digital utilization device 14. In the same manner an OR gate, which produces a positive output signal when either of its input terminals receives a positive signal, having input terminals commonly coupled to resistor 11 and output terminal coupled to digital utilization system 14, may perform the function of buffer 13. Yet another embodiment for buffer stage 13 may be provided by an even number of inverters connected in cascade between resistor 11 and digital utilization system 14. The even number of inversions is, of course, to assure a like polarity signal at input terminal 16 and output terminal 17. These examples are merely illustrative and not exclusionary. It will be apparent to those skilled in the digital art that any number of gate and amplifier combinations may be used to satisfy the requirements of buffer state 13 provided they provide a gain of more than one and produce an output signal of the same polarity as the input signal and are in the sense "noninverting" stages.

Figure 2:
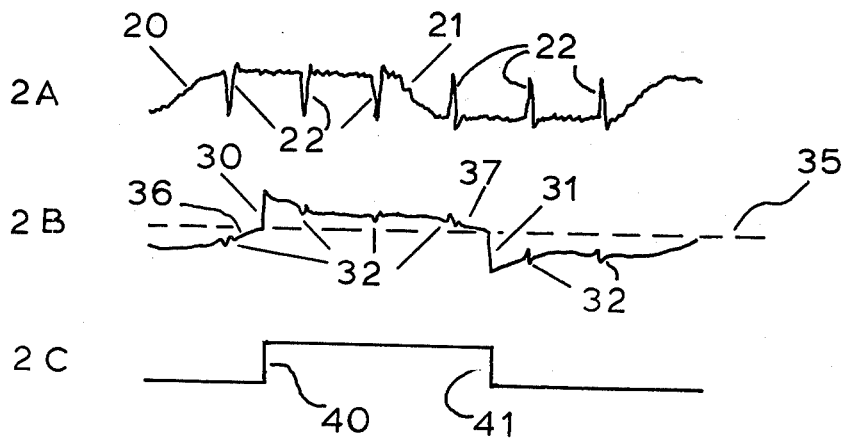
FIG. 2 shows a group of signal waveforms associated with the operation of the present invention circuit.

The operation of the present invention waveform conditioning circuit is best understood by reference to waveforms 2A, 2B and 2C shown in FIG. 2. More particularly, waveform 2A shows a digital pulse output signal of digital information source 10 having a positive going leading edge 20 and a negative going trailing edge 21. Also present on waveform 2A are a number of noise spikes or extraneous pulses 22 exemplary of the type which often contaminate a binary encoded signal. This signal applied via resistor 11 to the input of buffer stage 13 (e.g., a noninverting amplifier) produces a corresponding output signal having the same polarity. Capacitor 12 couples back a differentiated portion of the output signal 2C of buffer stage 13 which is combined with input waveform 2A to form the signal shown in FIG. 2B which appears at terminal 16 in FIG. 1. The integrating effect of resistor 11 and capacitor 12 forms an increasing ramp signal 36 after the input has changed to the positive or "high" state, which upon reaching threshold 35 (of the active region of the amplifier of the buffer stage) causes buffer stage 13 to abruptly change output state and produce a sharp rise 30. This large offset at the input prevents any immediate recrossing of the threshold 35, and hence any oscillations or false multiple counts at logic transitions. After the negative transition 21 of input waveform 2A, the integration of resistor 11 and capacitor 12 then produces a decreasing ramp 37 until threshold 35 is again reached causing an abrupt fall 31. Noise spikes 22 in waveform 2A are attenuated by the integrating effect of resistor 11 and capacitor 12 and appear as attenuated remnants 32 in waveform 2B. The purpose of resistor 15 is to provide sufficient positive feedback (hysteresis) at low frequencies to prevent self-oscillation during extremely slow input transitions. It will be apparent to those skilled in the art however that resistor 15 may be omitted from the described embodiments without departing from the spirit of the present invention. Resistor 11 need not necessarily be a separate component but its function may be served by an internal resistance in signal source 10.

The positive feedback provided by capacitor 12 causes the switching between logic states to be regenerative or self-enforcing. Once threshold 35 has been crossed the system rapidly converts to the opposite logic state. However, the noise signals 22 are integrated or filtered by the action of capacitor 12 and resistor 11 such that they are insufficient in amplitude to affect the logic state of buffer 13. As a result, a virtually noise free signal delayed in time from that which originally stimulated the wave conditioning circuit (shown in waveform 2C) is produced at the output 17 of buffer stage 13. The positive feedback function of the wave conditioning circuit permits the maintenance of a high or fast rise time 40 and a corresponding fast fall time 41 which is, of course, desirable in digital information systems.

Figure 3:
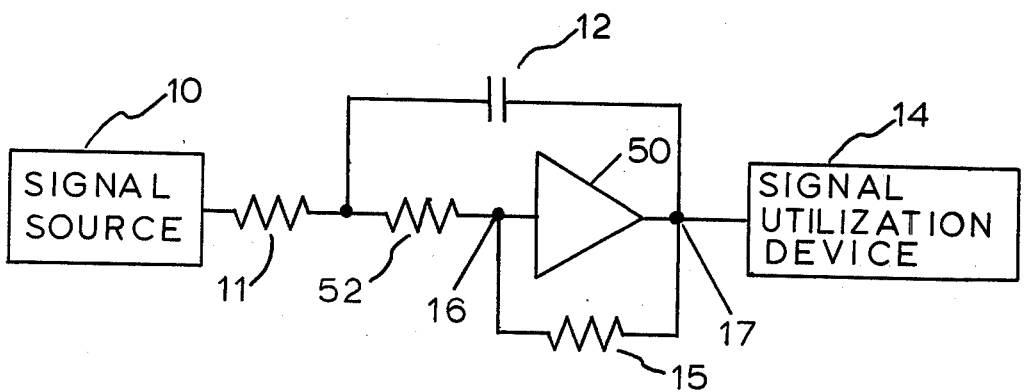
FIG. 3 shows the circuit of FIG. 1 adapted to a C-MOS buffer stage.

FIG. 3 shows the present invention waveform conditioning circuit adapted to utilize C-MOS logic elements. The operation and structure of the C-MOS embodiment of FIG. 3 is essentially the same as that set forward in conjunction with FIGS. 1 and 2 above. The major difference, however, is the imposition of a current limiting resistor 52 between input terminal 16 of a C-MOS buffer stage 50 and the junction of resistor 11 and feedback capacitor 12. The function of resistor 52 is to provide current limiting to protect the more sensitive circuitry within C-MOS buffer stage 50.

As an example of a specific embodiment, the noninverting amplifier 50 is two stages of a 4069 C-MOS. These are well known and, for example, are described in Motorola's Semi Conductor Data Library CMOS, Vol. 5 - Series B, pg. 5-136. Resistors 11 and 52 are 10k ohms. Resistor 15 is 100k ohms and capacitor 12 is 0.022 mf. This example is suitable for operation at 1000 Hertz.

Other minor modifications may be required to adapt the principles set forth in this disclosure to other logic systems using means well known to those skilled in the art.

From the above disclosure it is obvious that the present invention is a simple yet novel device which combines the best characteristics of several older more complex devices while avoiding their shortcomings. Like an integrator, it attenuates noise pulses, but it avoids the slow rise and fall times. Like a Schmitt trigger, it enhances rise and fall times, but it will not trigger even on large noise spikes and it does not have the displaced thresholds. Like the one shot multivibrator it has good rise and fall times and is immune to signals immediately after a transition, but it responds to both polarities and maintains its noise immunity between input transitions.

I claim:

1. A digital waveform conditioning circuit for removing extraneous noise and switching transients for use in a digital electronic system in which information is conveyed as signals having predetermined logic states, said signals being subjected to extraneous noise and switching transients which tend to produce undesired reactions within said system, said circuit comprising:

signal buffer amplifier means having a gain of more than one, responsive to applied signals, producing output signals having the same polarity as the applied signals, said signal buffer amplifier means including a noninverting buffer amplifier having an input terminal and an output terminal; and feedback means, coupled to said signal buffer amplifier means, combining the functions of integrating said applied signals and adding a portion of said output signal to said applied signals, said feedback means including a capacitor coupled between said input and output terminals, said feedback means including a series resistor coupling said input terminal to said information system;

whereby said amplifier means is operating in the switching mode with said feedback means ensuring abrupt changes between logic states in said output signals.

2. The digital waveform conditioning circuit set forth in claim 1 further including a current limiting resistor connected between said capacitor and the input terminal of said buffer amplifier.

3. The digital waveform conditioning circuit set forth in claim 2 further including a shunt resistor coupled between said input and output terminals for inhibiting the production of oscillatory signals.

4. The digital waveform conditioning circuit set forth in claim 1 further including a shunt resistor coupled between said input and output terminals for inhibiting the production of oscillatory signals.

* * * * *